US010879307B2

(12) United States Patent
Tsai et al.

(10) Patent No.: US 10,879,307 B2
(45) Date of Patent: Dec. 29, 2020

(54) MAGNETIC DEVICE AND MAGNETIC RANDOM ACCESS MEMORY

(71) Applicant: TAIWAN SEMICONDUCTOR MANUFACTURING CO., LTD., Hsinchu (TW)

(72) Inventors: Wilman Tsai, Saratoga, CA (US); Shy-Jay Lin, Jhudong Township (TW); Mingyuan Song, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/427,308

(22) Filed: May 30, 2019

(65) Prior Publication Data

US 2020/0098407 A1 Mar. 26, 2020

Related U.S. Application Data

(60) Provisional application No. 62/734,484, filed on Sep. 21, 2018.

(51) Int. Cl.

| | |
|---|---|
| ***H01L 27/22*** | (2006.01) |
| ***H01L 27/105*** | (2006.01) |
| ***H01L 43/08*** | (2006.01) |
| ***H01L 43/10*** | (2006.01) |
| ***H01L 43/12*** | (2006.01) |

(52) U.S. Cl.

CPC .......... *H01L 27/228* (2013.01); *H01L 27/105* (2013.01); *H01L 27/224* (2013.01); *H01L 43/08* (2013.01); *H01L 43/10* (2013.01); *H01L 43/12* (2013.01)

(58) Field of Classification Search

CPC ..... G11C 11/161; H01L 27/228; H01L 43/08; H01L 43/10; H01L 43/12

See application file for complete search history.

(56) References Cited

U.S. PATENT DOCUMENTS

| | | | |
|---|---|---|---|
| 6,347,049 | B1 | 2/2002 | Childress et al. |
| 7,508,042 | B2 | 3/2009 | Guo |

(Continued)

FOREIGN PATENT DOCUMENTS

| | | | |
|---|---|---|---|
| KR | 10-2017-0057464 | A | 5/2017 |
| KR | 10-2017-0093546 | A | 8/2017 |

(Continued)

OTHER PUBLICATIONS

Soo Young Jang et al., "Magnetic dead layer in amorphous CoFeB layers with various top and bottom structures," Journal of Applied Physics 107, 09C707 (2010).

(Continued)

*Primary Examiner* — Changhyun Yi

(74) *Attorney, Agent, or Firm* — McDermott Will & Emery LLP

(57) ABSTRACT

A spin-orbit-torque (SOT) magnetic device includes a bottom metal layer, a first magnetic layer disposed over the bottom metal layer, a spacer layer disposed over the first magnetic layer, and a second magnetic layer disposed over the spacer layer. A diffusion barrier layer for suppressing metal elements of the first magnetic layer from diffusing into the bottom metal layer is disposed between the bottom metal layer and the first magnetic layer.

20 Claims, 4 Drawing Sheets

(56) References Cited

U.S. PATENT DOCUMENTS

| | | | |
|---|---|---|---|
| 9,666,256 B1 | 5/2017 | Lai et al. | |
| 2014/0056060 A1 | 2/2014 | Khvalkovskiy et al. | |
| 2017/0263859 A1 | 9/2017 | Tang et al. | |
| 2019/0043548 A1 | 2/2019 | Park et al. | |
| 2020/0006626 A1* | 1/2020 | Smith | H01L 43/08 |

FOREIGN PATENT DOCUMENTS

| | | | |
|---|---|---|---|
| KR | 10-2017-0105395 | A | 9/2017 |
| TW | 200809858 | A | 2/2008 |
| TW | 201709578 | A | 3/2017 |
| WO | 2016/060804 | A1 | 4/2016 |

OTHER PUBLICATIONS

Shouzhong Peng et al., "Origin of interfacial perpendicular magnetic anisotropy in MgO/CoFe/metallic capping layer structures," Scientific Reports 5, 18173 (Dec. 11, 2015).

Kai-Uwe Demasius et al., "Enhanced spin-orbit torques by oxygen incorporation in tungsten films," Nature Communications, 7, 10644 (Feb. 25, 2016).

* cited by examiner

MAGNETIC DEVICE AND MAGNETIC RANDOM ACCESS MEMORY

RELATED APPLICATION

This application claims priority to U.S. Provisional Patent Application No. 62/734,484 filed Sep. 21, 2018, the entire contents of which are incorporated herein by reference.

BACKGROUND

An MRAM offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. One type of an MRAM is a spin transfer torque random access memory (STT-RAM). An STT-RAM utilizes a magnetic tunneling junction (MTJ) written at least in part by a current driven through the MTJ. Another type of an MRAM is a spin orbit torque RAM (SOT-RAM).

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

In a spin orbit torque type magnetic device, thermal stability of perpendicular magnetic anisotropy (PMA) is one of the critical performance metrics. The perpendicular magnetic anisotropy is affected by an interface between a spin orbit active layer (e.g., a heavy metal layer) and a free magnetic layer (e.g., a data storage layer). In particular, interfacial diffusion may degrade the perpendicular magnetic anisotropy performance. Defects and non-ideal structure of the interface may result in perpendicular magnetic anisotropy instability and a thicker magnetic dead layer (MDL), at which ferromagnetic order is lost. The present disclosure is directed to a novel interface between the spin orbit active layer and the free magnetic layer to solve the aforementioned problems in the SOT magnetic device.

Figure 1B:
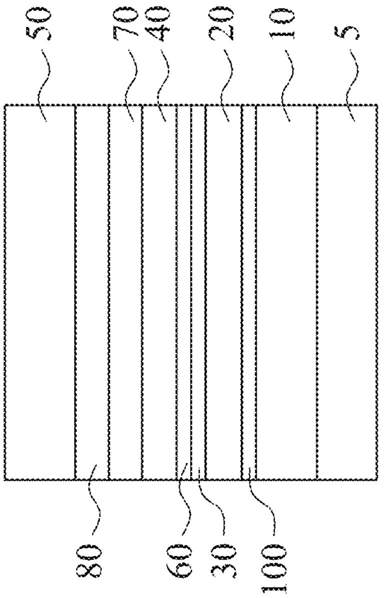
FIG. 1B is a schematic view of a SOT MRAM cell according to an embodiment of the present disclosure.
Figure 1A:
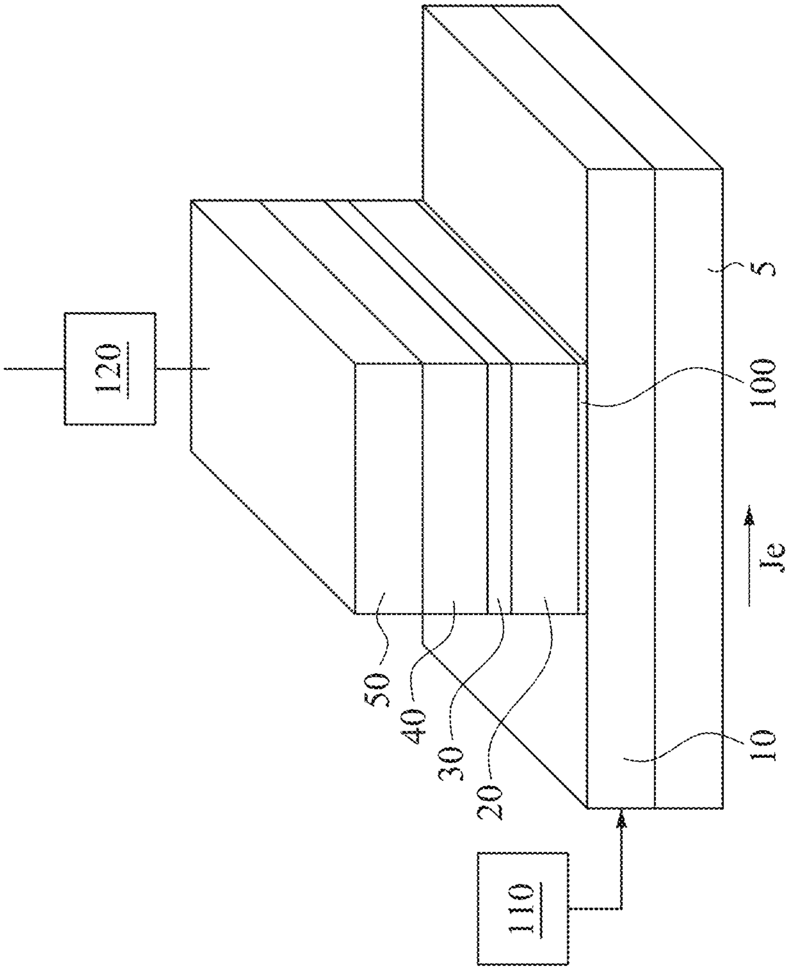
FIG. 1A is a schematic view of a SOT MRAM cell according to an embodiment of the present disclosure.

FIG. 1A is a schematic view of a SOT MRAM cell (SOT magnetic device) that utilizes spin-orbit interaction in switching according to an embodiment of the present disclosure.

The SOT magnetic device includes a bottom metal layer 10, as a spin-orbit interaction active layer, formed over a support layer 5. Further, the SOT magnetic device includes a first magnetic layer 20, which is a free magnetic layer or a data storage layer, disposed over the bottom metal layer 10, a nonmagnetic spacer layer 30 disposed over the first magnetic layer, and a second magnetic layer 40, as a reference layer, disposed over the nonmagnetic spacer layer 30. In some embodiments, a top conductive layer 50, as an electrode, is disposed over the second magnetic layer 40. Further, in embodiments of the present disclosure, a diffusion barrier layer 100 is disposed between the bottom metal layer 10 and the first magnetic layer 20, as shown in FIG. 1A.

The magnetic moment of the free layer 20 (first magnetic layer) is switched using the spin-orbit interaction effect. In some embodiments, the magnetic moment of the first magnetic layer 20 is switched using only the spin-orbit interaction effect. In other embodiments, the magnetic moment of the first magnetic layer 20 is switched using a combination of effects. For example, the magnetic moment of the first magnetic layer 20 is switched using spin transfer torque as a primary effect that may be assisted by torque induced by the spin-orbit interaction. In other embodiments, the primary switching mechanism is torque induced by the spin-orbit interaction. In such embodiments, another effect including, but not limited to, spin transfer torque, may assist in switching.

The bottom metal layer 10 is a spin orbit active layer that has a strong spin-orbit interaction and that can be used in switching the magnetic moment of the first magnetic layer 20. The bottom metal layer 10 is used in generating a spin-orbit magnetic field H. More specifically, a current driven in a plane through the bottom metal layer 10 and the attendant spin-orbit interaction may result in the spin-orbit magnetic field H. This spin orbit magnetic field H is equivalent to the spin-orbit torque T on magnetization, where $T=\gamma[M\times H]$ in the first magnetic layer 20. The torque and magnetic field are thus interchangeably referred to as spin-orbit field and spin-orbit torque. This reflects the fact that the spin-orbit interaction is the origin of the spin-orbit torque and spin-orbit field. Spin-orbit torque occurs for a current driven in a plane in the bottom metal layer 10 and a spin-orbit interaction. In contrast, spin transfer torque is due to a perpendicular-to-plane current flowing through the first magnetic layer 20, the nonmagnetic spacer layer 30 and the second magnetic layer 40 (reference layer), that injects spin polarized charge carriers into the first magnetic layer 20. The spin-orbit torque T may rapidly deflect the magnetic moment of the first magnetic layer 20 from its equilibrium state parallel to the easy axis. The spin-orbit torque T may tilt the magnetization of the first magnetic layer 20 considerably faster than conventional STT torque of a similar maximum amplitude. In some embodiments, switching can be completed using spin-orbit torque. In other embodiments, another mechanism such as spin transfer may be used to complete switching. The spin-orbit field/spin-orbit torque generated may thus be used in switching the magnetic moment of the first magnetic layer 20.

In some embodiments, the interaction of the bottom metal layer includes the spin Hall effect. For the spin Hall effect, a current Je is driven in the plane of the bottom metal layer 10 (i.e., current-in-plane, substantially in the x-y plane in FIG. 1A). In other words, the current Je is driven perpendicular to the stacked direction of the films including the bottom metal layer 10 and the first magnetic layer 20 (i.e., perpendicular to the normal to the surface, the z-direction in FIG. 1A). Charge carriers having spins of a particular orientation perpendicular to the direction of current and to the normal to the surface (z-direction) accumulate at the surfaces of the bottom metal layer 10. A majority of these spin-polarized carriers diffuse into the first magnetic layer 20 (free layer). This diffusion results in the torque T on the magnetization of the first magnetic layer 20. Since torque on the magnetization is equivalent to the effective magnetic field on the magnetization, as set forth above, the spin accumulation equivalently results in the field H on the first magnetic layer 20. The spin-orbit field for the spin-Hall effect is the cross product of the spin-orbit polarization and the magnetic moment of the first magnetic layer 20. As such, the magnitude of the torque is proportional to in the plane current density Je and spin polarization of the carriers. The spin-Hall effect may be used in switching the magnetic stacked layer shown in FIG. 1A when the polarization induced by the spin-Hall effect is parallel to the easy axis of the first magnetic layer 20. To obtain the spin-orbit torque T, the current pulse is driven in plane through the bottom metal layer 10. The resulting spin-orbit torque T counteracts damping torque, which results in the switching of the magnetization of the first magnetic layer 20 in an analogous manner to conventional STT switching.

As set forth above, the bottom metal layer 10 is a spin orbit active layer that causes a strong spin orbit interaction with the first magnetic layer 20 (free layer). In some embodiments, the bottom metal layer 10 includes one or more heavy metals or materials doped by heavy metals. In certain embodiments, α-W, β-W and/or β-Ta is used as the bottom metal layer 10. A thickness of the bottom metal layer 10 is in a range from about 2 nm to 20 nm in some embodiments and is in a range from about 5 nm to 15 nm in other embodiments.

The first magnetic layer 20 as a data storage layer is a free layer having a magnetic moment that is switchable. The first magnetic layer 20 includes a cobalt iron boron (CoFeB) layer, a cobalt/palladium (CoPd) layer and/or a cobalt iron (CoFe) layer having a thickness in a range from about 0.6 nm to about 1.2 nm in some embodiments. In other embodiments, the first magnetic layer 20 includes multiple layers of magnetic materials. In certain embodiments, the first magnetic layer is $Fe_xCo_yB_{1-x-y}$, where $0.50\le x\le 0.70$ and $0.10\le y\le 0.30$. In other embodiments, $0.55\le x\le 0.65$ and $0.15\le y\le 0.25$.

The nonmagnetic spacer layer 30 is made of a dielectric material, and functions as a tunneling barrier. In some embodiments, the nonmagnetic spacer layer 30 includes a crystalline or an amorphous magnesium oxide (MgO) layer. In other embodiments, the nonmagnetic spacer layer 30 is made of aluminum oxide or a conductive material, such as Cu. In some embodiments, the nonmagnetic spacer layer 30 has a thickness in a range from about 0.3 nm to about 1.2 nm, and in other embodiments, the thickness of the nonmagnetic layer 30 is in a range from about 0.5 nm to about 1.0 nm. In this disclosure, an "element layer" or a "compound layer" generally means that the content of the element or compound is more than 99%.

The second magnetic layer 40 is a reference layer of which magnetic moment does not change. In some embodiments, the second magnetic layer 40 is made of the same material as the first magnetic layer 20 as set forth above. In some embodiments, the second magnetic layer 40 includes multiple layers of magnetic materials. In some embodiments, the second magnetic layer 40 includes a multilayer structure of cobalt (Co) and platinum (Pt). In some embodiments, a thickness of the second magnetic layer 40 is in a range from about 0.2 nm to about 1.0 nm and is in a range from about 0.3 nm to about 0.5 nm in other embodiments.

In some embodiments, the second magnetic layer 40 is a multilayer including a synthetic antiferromagnetic layer having ferromagnetic layers separated by nonmagnetic layer, such as Ru. In some embodiments, a pinning layer, such as an antiferromagnetic layer that fixes the magnetic moment of the second magnetic layer 40 in place is disposed over the second magnetic layer 40 with a Ru layer interposed therebetween. The first and second magnetic layers are crystalline in some embodiments.

The top conductive layer 50 as an electrode includes one or more layers of Ta, Ru, Au, Cr and Pt.

The support layer 5 is made of a dielectric material, such as silicon oxide, silicon oxynitride, silicon nitride, aluminum oxide, magnesium oxide or any other suitable material. In some embodiments, the support layer 5 is a shallow trench isolation layer, an interlayer dielectric (ILD) layer or an inter-metal dielectric (IMD) layer in a semiconductor device.

In the present disclosure, a diffusion barrier layer 100 is disposed between the bottom metal layer 10 and the first magnetic layer 20 to improve an interface property between them. In some embodiments, the diffusion barrier layer 100 can suppress metallic elements in the first magnetic layer 20 from diffusing into the bottom metal layer 10. When the first magnetic layer 20 is in direct contact with the bottom metal layer 10, a relatively thick magnetic dead layer is formed and metallic elements, such as Fe and Co, in the first magnetic layer 20 diffuse into the bottom metal layer by a subsequent thermal process at about 300° C. to about 450° C.

In the present disclosure, as shown in FIG. 1A, a diffusion barrier layer 100 that suppresses metallic elements in the first magnetic layer 20 from diffusing into the bottom metal layer 10 is disposed between the first magnetic layer 20 and the bottom metal layer 10. A thickness of the diffusion barrier layer is in a range from about 0.1 nm to about 0.6 nm in some embodiments, and is in a range from about 0.2 nm to about 0.5 nm in other embodiments.

In some embodiments, the first magnetic layer 20 includes iron and cobalt, and thus the diffusion barrier layer 100 suppresses diffusion of iron and/or cobalt from the first magnetic layer 20 to the bottom metal layer 10. In some embodiments, the diffusion barrier layer 100 is an iron rich layer including iron, and an atomic percentage of iron in the diffusion barrier layer 100 is higher than an atomic percentage of iron in the first magnetic layer 20. In some embodiments, the atomic percentage of iron in the diffusion barrier layer 100 is higher at the first magnetic layer side than at the bottom metal layer side. In certain embodiments, the amount of iron gradually decreases from the first magnetic layer side to the bottom metal layer side.

In some embodiments, the first magnetic layer 20 further includes boron, and the diffusion barrier layer 100 also further includes boron. An atomic percentage of the boron in the first magnetic layer 20 is the same as or different from an atomic percentage of the boron in the diffusion barrier layer 100. In certain embodiments, the atomic percentage of the boron in the diffusion barrier layer 100 is higher than the atomic percentage of the boron in the first magnetic layer 20.

In some embodiments, the first magnetic layer 20 is $Fe_xCo_yB_{1-x-y}$, as set forth above, and the diffusion barrier layer 100 is $Fe_zB_{1-z}$, where $z>x$. In some embodiments, $0.50 \leq x \leq 0.70$, $0.10 \leq y \leq 0.30$ and $0.65 \leq z \leq 0.90$. In other embodiments, $0.55 \leq x \leq 0.65$, $0.15 \leq y \leq 0.25$ and $0.65 \leq z \leq 0.75$.

In some embodiments, the diffusion barrier layer 100 is a cobalt rich layer, and an atomic percentage of cobalt is higher than an atomic percentage of cobalt in the first magnetic layer 20. In some embodiments, the atomic percentage of cobalt in the diffusion barrier layer 100 is higher at the first magnetic layer side than at the bottom metal layer side. In certain embodiments, the amount of cobalt gradually decreases from the first magnetic layer side to the bottom metal layer side.

The diffusion barrier layer 100 may be made of other materials. In some embodiments, the diffusion barrier layer 100 is made of a nonmagnetic metal material, such as magnesium. In other embodiments, the diffusion barrier layer 100 is made of a dielectric material, such as a metal oxide. In some embodiments, the metal oxide is an oxide of the metal contained in the bottom metal layer. In certain embodiments, the metal oxide is one of tungsten oxide and tantalum oxide.

FIG. 1B is a schematic view of a SOT MRAM cell according to another embodiment of the present disclosure. Material, configuration, dimensions and/or processes the same as or similar to the foregoing embodiments described in FIG. 1A may be employed in the following embodiments, and detailed explanation thereof may be omitted.

Similar to FIG. 1A, a bottom metal layer 10 is formed over a support layer 5. In some embodiments, the bottom metal layer 10 is a β-W layer. A first magnetic layer 20, as a free or reference layer, is formed over the bottom metal layer 10. In some embodiments, the first magnetic layer 20 includes iron and cobalt. In certain embodiments, the first magnetic layer 20 further includes boron. A nonmagnetic spacer layer 30 made of, for example, magnesium oxide, is formed over the first magnetic layer 20, and a second magnetic layer 40 is formed over the nonmagnetic spacer layer 30.

In some embodiments, an intermediate metal layer 60 is disposed between the nonmagnetic spacer layer 30 and the second magnetic layer 40. In some embodiments, the intermediate metal layer 60 is made of a nonmagnetic material. In certain embodiments, the intermediate metal layer 60 is made of Mg. A thickness of the intermediate metal layer 60 is in a range from about 0.1 nm to about 0.6 nm in some embodiments and is in a range from about 0.2 nm to about 0.5 nm in other embodiments. In other embodiments, no intermediate metal layer is used.

In some embodiments, an antiferromagnetic layer 70 is formed over the second magnetic layer, and a third magnetic layer 80 is formed over the antiferromagnetic layer 70, as shown in FIG. 1B. The anti-ferromagnetic layer 70 helps to fix the magnetic moment of the second magnetic layer 40. In some embodiments, the antiferromagnetic layer 70 includes ruthenium (Ru) or any other suitable antiferromagnetic material. In some embodiments, the thickness of the antiferromagnetic layer 70 is in a range from about 0.2 nm to about 0.8 nm.

The third magnetic layer 80 includes one or more layers of magnetic materials. In some embodiments, the third magnetic layer 80 includes one or more of cobalt, iron, nickel and platinum. In some embodiments, the material of the third magnetic layer 80 is the same as or different from the material of the second magnetic layer 40. In certain embodiments, the third magnetic layer 80 is a CoPt layer. A thickness of the third magnetic layer is in a range from about 0.5 nm to about 1.5 nm in some embodiments and is in a range from about 0.7 nm to about 1.2 nm in other embodiments.

Further, as shown in FIG. 1B, a diffusion barrier layer 100 is disposed between the bottom metal layer 10 and the first magnetic layer 20, to prevent the metal elements of the first magnetic layer 20 from diffusing into the bottom metal layer 10. The diffusion barrier layer 100 is one of an iron rich layer having a higher iron atomic percentage than the first magnetic layer, a cobalt rich layer having a higher cobalt atomic percentage than the first magnetic layer, a magnesium layer, a tungsten oxide layer and a tantalum oxide layer.

In some embodiments, iridium is included in any of the diffusion barrier layer 100 and the intermediate metal layer. In some embodiments, an iridium containing layer is inserted between any two adjacent layers as shown in FIG. 1B. The iridium containing layer can be one selected from the group consisting of an iridium layer, an iridium oxide layer, a bilayer structure of an iridium layer and an iridium oxide layer, an iridium-titanium nitride layer, a bilayer structure of an iridium layer and a tantalum layer, and a binary alloy layer of iridium and tantalum.

Each of the layers shown in FIG. 1A and FIG. 1B can be formed by suitable film formation methods, which include physical vapor deposition (PVD) including sputtering; molecular beam epitaxy (MBE); pulsed laser deposition (PLD); atomic layer deposition (ALD); electron beam (e-beam) epitaxy; chemical vapor deposition (CVD); or derivative CVD processes further comprising low pressure CVD (LPCVD), ultrahigh vacuum CVD (UHVCVD), reduced pressure CVD (RPCVD); electro plating, or any combinations thereof.

In some embodiments, a film stack is formed by the aforementioned film formation operations, and after the film stacks are formed, a patterning operation including one or more lithography and etching operations is performed on the film stack to form a SOT cell as shown in FIG. 1A.

Figure 2A:
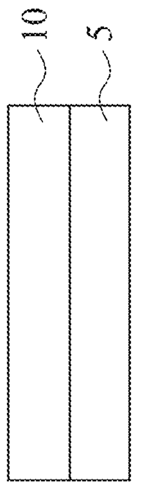
FIGS. 2A, 2B, 2C and 2D show schematic cross sectional views of manufacturing operations of a SOT MRAM cell according to embodiments of the present disclosure.
Figure 2B:
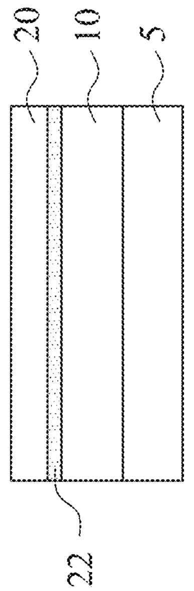
Figure 2C:
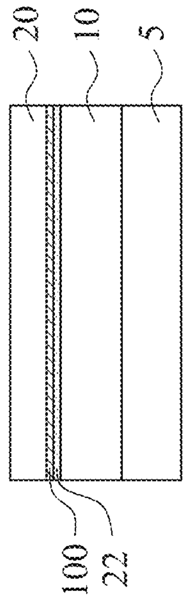

FIGS. 2A-2C shows a sequential manufacturing operation for forming the diffusion barrier layer 100 according to an embodiment of the present disclosure. It is understood that additional operations can be provided before, during, and after the processes shown by FIGS. 2A-2C, and some of the operations described below can be replaced or eliminated, for additional embodiments of the method. The order of the operations/processes may be interchangeable.

As shown in FIG. 2A, a bottom metal layer 10 is formed over a support layer 5. The bottom metal layer 10 can be formed by PVD, CVD, ALD or any other suitable film formation methods. Then, as shown in FIG. 2B, a first magnetic layer 20 is formed by using PVD, CVD, ALD or any other suitable film formation methods. After the first magnetic layer 20 is formed, as shown in FIG. 2B, a magnetic dead layer 22 is formed between the first magnetic layer 20 and the bottom metal layer 10. The magnetic dead layer 22 adversely affects the performance of the SOT magnetic device. The thickness of the magnetic dead layer 22 is in a range from about 0.2 nm to about 0.8 nm.

Then, as shown in FIG. 2C, a process to make an iron rich diffusion barrier layer 100 is performed. In some embodiments, the process is a thermal annealing process. A process temperature of the thermal annealing process is in a range from about 350° C. to about 450° C., and is in a range from about 375° C. to 425° C. in other embodiments. A process time of the thermal annealing is in a range from about 30 min to about 240 min in some embodiments, and is in a range from about 90 min to about 180 min in other embodiments. By the thermal annealing process, an iron rich layer, as the diffusion barrier layer 100, is formed as shown in FIG. 2C. In some embodiments, the thickness of the magnetic dead layer 22 decreases. In certain embodiments, after the thermal annealing process, the thickness of the magnetic dead layer 22 is from about 0.1 nm to about 0.3 nm. In a specific embodiment, the magnetic dead layer 22 disappears.

In other embodiments, a plasma treatment process to make an iron/cobalt rich diffusion barrier layer 100 is performed. After the first magnetic layer 20 is formed as shown in FIG. 2B, the first magnetic layer 20 is subjected to plasma. The plasma is at least one plasma of argon, nitrogen and hydrogen in some embodiments. RF plasma, inductively coupled plasma (ICP) or electron-cyclotron resonance (ECR) plasma or any other plasma can be utilized. In some embodiments, a process time of the plasma treatment is in a range from 1 min to 60 min and is in a range from about 10 min to about 30 min in other embodiments. During the plasma treatment, the stacked structure is heated at a temperature in a range from about 250° C. to about 450° C., in some embodiments. By the plasma treatment, an iron rich layer, as the diffusion barrier layer 100, is formed as shown in FIG. 2C. In some embodiments, the thickness of the magnetic dead layer 22 decreases. In certain embodiments, after the plasma treatment, the thickness of the magnetic dead layer 22 is from about 0.1 nm to about 0.3 nm. In a specific embodiment, the magnetic dead layer 22 disappears.

Figure 2D:
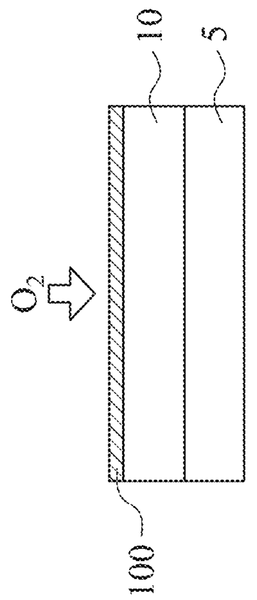

Further, when the diffusion barrier layer 100 is an oxide of tungsten or tantalum, the diffusion barrier layer 100 can be formed by directly oxidizing the surface of the bottom metal layer 10 made or tungsten or tantalum, as shown in FIG. 2D. The oxidation process includes a thermal oxidation process, a plasma oxidation process or a wet chemical oxidation process. After the oxide of tungsten or tantalum is formed as the diffusion barrier layer 100, the first magnetic layer 20 is formed.

In other embodiments, the diffusion barrier layer 100 is formed by deposition methods, such as PVD, CVD, MBE, ALD, electro plating or any other suitable methods.

Figure 3A:
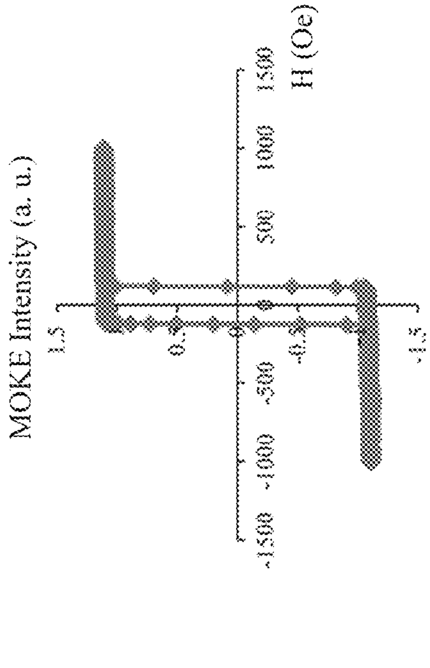
FIGS. 3A, 3B, 3C and 3D show experimental results of perpendicular magnetic anisotropy of SOT magnetic devices with and without a diffusion barrier layer.
Figure 3B:
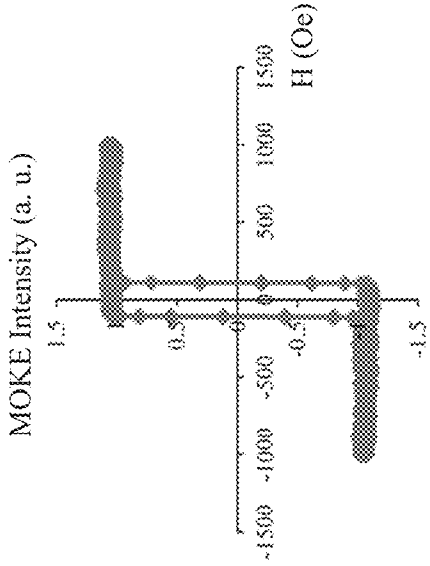
Figure 3C:
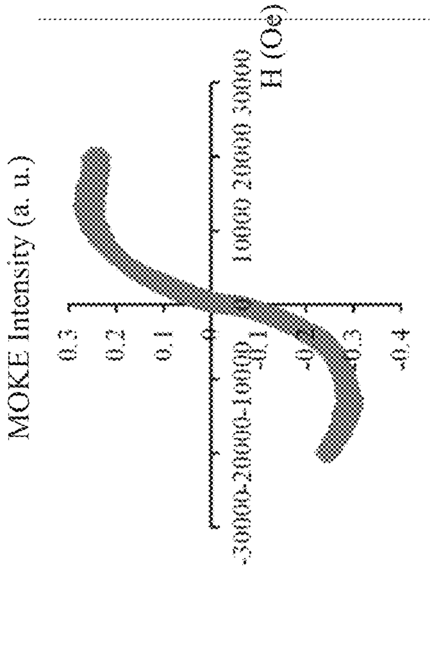
Figure 3D:
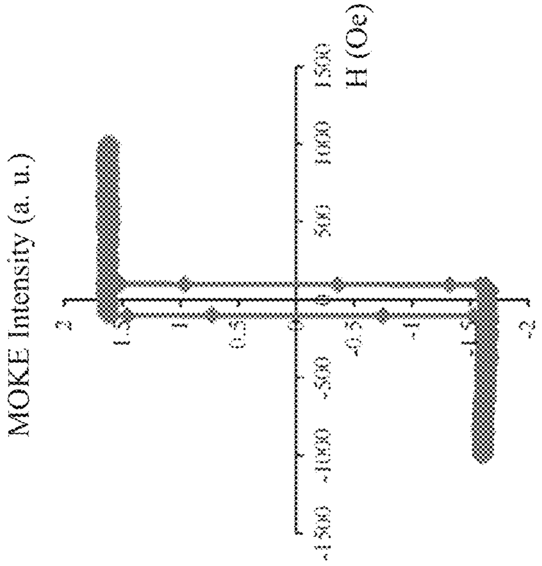

FIGS. 3A, 3B, 3C and 3D show experimental results of perpendicular magnetic anisotropy (perpendicular magnetic anisotropy) of SOT magnetic devices exhibiting effects of the diffusion barrier layer 100 according to the present disclosure. In FIGS. 3A-3D, the horizontal direction is a magnetic field (Oe), and the vertical axis is the magneto-optic Kerr effect (MOKE). FIGS. 3A and 3C show perpendicular magnetic anisotropy for a SOT magnetic cell without a diffusion barrier layer, and FIGS. 3B and 3D show perpendicular magnetic anisotropy for a SOT magnetic cell with a diffusion barrier layer 100. FIGS. 3A and 3B show the perpendicular magnetic anisotropy as initially formed and FIGS. 3C and 3D show the perpendicular magnetic anisotropy after the SOT magnetic cell is subjected to a thermal process at 400° C. for 50 min. As shown in FIGS. 3A and 3B, both the SOT magnetic cell without a diffusion barrier layer and the SOT magnetic cell with a diffusion barrier layer show good perpendicular magnetic anisotropy results having a clear hysteresis. However, after the SOT magnetic cell without a diffusion barrier layer is heated at 400° C., the perpendicular magnetic anisotropy result shows no hysteresis. In contrast, even after the SOT magnetic cell with a diffusion barrier layer is heated at 400° C., a good hysteresis was observed in the perpendicular magnetic anisotropy result. These results show that the diffusion barrier layer 100 according to the present disclosure can improve thermal stability of the SOT magnetic cell.

Figure 4A:
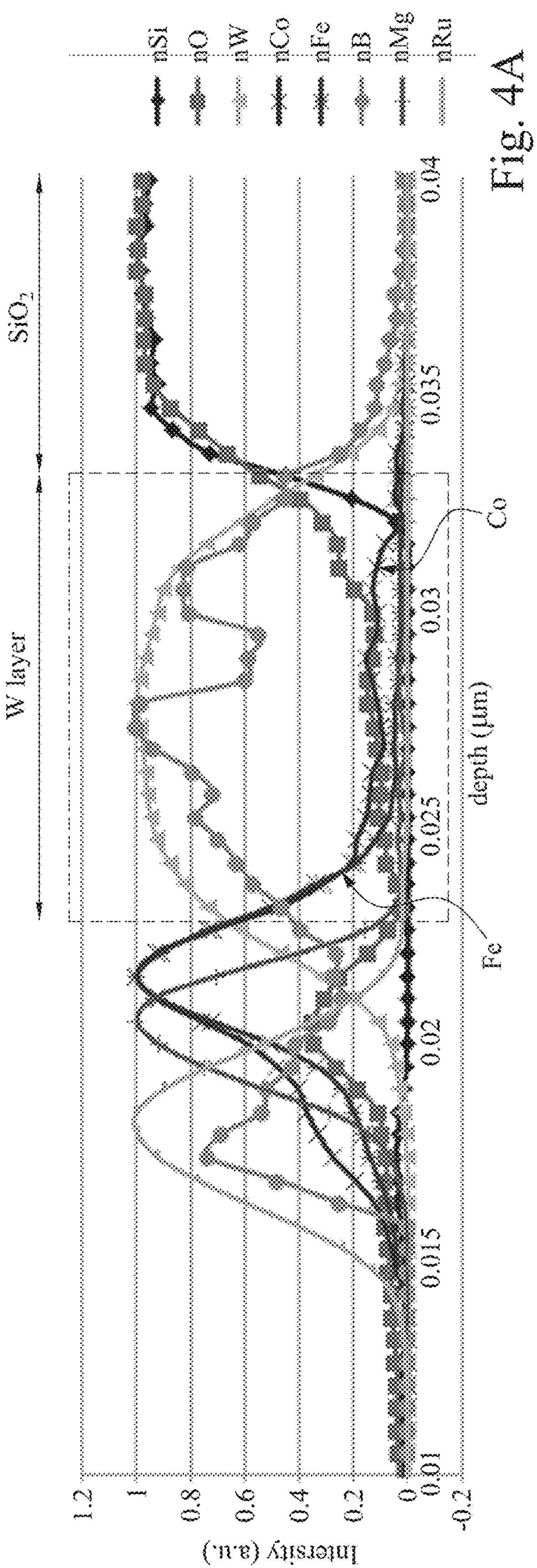
FIGS. 4A and 4B show experimental results of secondary ion mass spectroscopy.
Figure 4B:
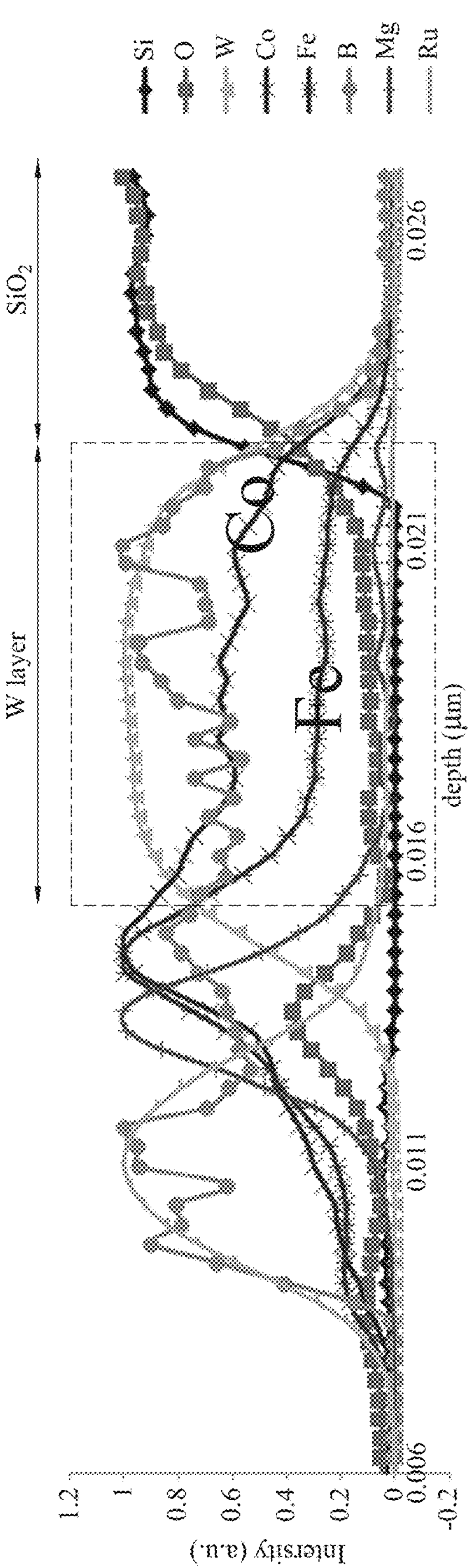

FIGS. 4A and 4B show experimental results exhibiting effects of the diffusion barrier layer 100 according to the present disclosure. FIGS. 4A and 4B are the results by energy dispersive X-ray spectrometry (EDX). Samples used in the EDX analysis include, from the bottom, a silicon oxide support layer, a tungsten layer as a bottom metal layer, a cobalt iron boron layer as a first magnetic layer, a magnesium oxide layer as a nonmagnetic spacer layer, a Mg layer as an intermediate metal layer, a cobalt iron boron layer as a second magnetic layer, and a Ru layer. The sample for FIG. 4A further includes an iron boron layer as a diffusion barrier layer, and the sample for FIG. 4B is the same as for FIG. 4A except it does not include a diffusion barrier layer. The samples are subjected to a heat treatment at 400° C. for 50 min.

In this experiment, the first and second magnetic layers are $Fe_{0.6}Co_{0.2}B_{0.2}$ and the diffusion barrier layer is $Fe_{0.7}B_{0.3}$. The thickness of the tungsten layer is about 10 nm, the thickness of the first magnetic layer is about 0.8 nm, the thickness of the magnesium oxide layer is about 1.0 nm, the thickness of the Mg layer is about 0.3 nm, the thickness of second magnetic layer is about 0.4 nm and the thickness of the Ru layer is about 3 nm.

As shown in FIG. 4B, significant amounts of iron (Fe) and cobalt (Co) diffuse into the tungsten layer, while as shown in FIG. 4A, diffusion of iron and cobalt into the tungsten layer is effectively suppressed. In view of FIGS. 3A-3D and 4A and 4B, by using the diffusion barrier layer 100, diffusion of iron and cobalt from the first conductive layer into the tungsten layer (bottom metal layer) can be effectively suppressed, thereby improving the thermal stability of the SOT magnetic device.

When thermal stability of an SOT magnetic cell is high, it is easier to integrate the SOT magnetic cell as an MRAM into a semiconductor device. In some embodiments, an MRAM device is formed at a back-end-of-line (BEOL) of the entire semiconductor manufacturing operation. In the BEOL, the structures formed over a semiconductor substrate are subjected to one or more thermal operations from about 400° C. to about 450° C. Accordingly, the SOT magnetic cell of the present disclosure is compatible with the BEOL process of a semiconductor manufacturing process.

In some embodiments, an MRAM cell includes the SOT magnetic device shown in FIG. 1A and a current source 110 and a switching element 120, such as a transistor.

It will be understood that not all advantages have been necessarily discussed herein, no particular advantage is required for all embodiments or examples, and other embodiments or examples may offer different advantages.

For example, in the present disclosure, a diffusion barrier layer is interposed between a bottom metal layer (a spin orbit active layer) and a first magnetic layer (a free magnetic layer). The diffusion barrier layer suppresses diffusion of a metallic element, such as iron and cobalt, included in the first magnetic layer into the bottom metal layer. Thus, the interface property can be improved. For example, a thickness of a magnetic dead layer can be reduced. Further, the diffusion barrier layer specifically suppresses diffusion of the metallic element at a subsequent heating process. Accordingly, the spin orbit torque (SOT) magnetic device of the present disclosure exhibits improved perpendicular magnetic anisotropy (PMA), and is compatible with a semiconductor device fabrication process.

In accordance with an aspect of the present disclosure, a spin-orbit-torque (SOT) magnetic device includes a bottom metal layer, a first magnetic layer disposed over the bottom metal layer, a spacer layer disposed over the first magnetic layer, and a second magnetic layer disposed over the spacer layer. A diffusion barrier layer for suppressing metal elements of the first magnetic layer from diffusing into the bottom metal layer is disposed between the bottom metal layer and the first magnetic layer. In one or more of the foregoing and following embodiments, the first magnetic layer includes iron and cobalt. In one or more of the foregoing and following embodiments, the diffusion barrier layer includes iron, and an atomic percentage of iron in the diffusion barrier layer is higher than an atomic percentage of iron in the first magnetic layer. In one or more of the foregoing and following embodiments, the first magnetic layer further includes boron, and the diffusion barrier layer further includes boron. In one or more of the foregoing and following embodiments, an atomic percentage of the boron in the diffusion barrier layer is higher than an atomic percentage of the boron in the first magnetic layer. In one or more of the foregoing and following embodiments, the first magnetic layer is $Fe_xCo_yB_{1-x-y}$, and the diffusion barrier layer is $Fe_zB_{1-z}$, where z>x. In one or more of the foregoing and following embodiments, $0.50 \le x \le 0.70$ and $0.65 \le z \le 0.90$. In one or more of the foregoing and following embodiments, the diffusion barrier layer includes cobalt, and an atomic percentage of cobalt in the diffusion barrier layer is higher than an atomic percentage of cobalt in the first magnetic layer. In one or more of the foregoing and following embodiments, the diffusion barrier layer is made of magnesium. In one or more of the foregoing and following embodiments, the diffusion barrier layer is made of an oxide of tungsten or tantalum. In one or more of the foregoing and following embodiments, the bottom metal layer is made of tungsten or tantalum. In one or more of the foregoing and following embodiments, a thickness of the diffusion barrier layer is in a range from 0.1 nm to 0.6 nm. In one or more of the foregoing and following embodiments, the SOT magnetic device further includes an intermediate metal layer disposed between the spacer layer and the second magnetic layer. In one or more of the foregoing and following embodiments, the intermediate metal layer is made of magnesium and the spacer layer is made of magnesium oxide. In one or more of the foregoing and following embodiments, the SOT magnetic device further includes a top metal layer disposed over the second magnetic layer. In one or more of the foregoing and following embodiments, the top metal layer is made of ruthenium. In one or more of the foregoing and following embodiments, the second magnetic layer includes iron, cobalt and boron.

In accordance with another aspect of the present disclosure, a spin-orbit-torque (SOT) magnetic device includes a bottom metal layer, a first magnetic layer disposed over the bottom metal layer, a spacer layer disposed over the first magnetic layer, and a second magnetic layer disposed over the spacer layer. A magnetic dead layer is disposed between the bottom metal layer and the first magnetic layer, and a diffusion barrier layer for suppressing metal elements of the first magnetic layer from diffusing into the bottom metal layer is disposed between the magnetic dead layer and the first magnetic layer. In one or more of the foregoing and following embodiments, the first magnetic layer includes iron and cobalt. In one or more of the foregoing and following embodiments, the diffusion barrier layer includes iron, and an atomic percentage of iron in the diffusion barrier layer is higher than an atomic percentage of iron in the first magnetic layer. In one or more of the foregoing and following embodiments, the first magnetic layer and the diffusion barrier layer further include boron. In one or more of the foregoing and following embodiments, an atomic percentage of the boron in the diffusion barrier layer is higher than an atomic percentage of the boron in the first magnetic layer. In one or more of the foregoing and following embodiments, the first magnetic layer is $Fe_xCo_yB_{1-x-y}$, and the diffusion barrier layer is $Fe_zB_{1-z}$, where z>x. In one or more of the foregoing and following embodiments, $0.50 \le x \le 0.70$ and $0.65 \le z \le 0.90$. In one or more of the foregoing and following embodiments, the diffusion barrier layer includes cobalt, and an atomic percentage of cobalt in the diffusion barrier layer is higher than an atomic percentage of cobalt in the first magnetic layer. In one or more of the foregoing and following embodiments, the diffusion barrier layer is made of magnesium. In one or more of the foregoing and following embodiments, the diffusion barrier layer is made of an oxide of tungsten or tantalum. In one or more of the foregoing and following embodiments, the bottom metal layer is made of tungsten or tantalum. In one or more of the foregoing and following embodiments, a thickness of the diffusion barrier layer is in a range from 0.1 nm to 0.6 nm. In one or more of the foregoing and following embodiments, the SOT magnetic device further includes an intermediate metal layer disposed between the spacer layer and the second magnetic layer. In one or more of the foregoing and following embodiments, the intermediate metal layer is made of magnesium and the spacer layer is made of magnesium oxide. In one or more of the foregoing and following embodiments, the SOT magnetic device further includes a top metal layer disposed over the second magnetic layer. In one or more of the foregoing and following embodiments, the top metal layer is made of ruthenium. In one or more of the foregoing and following embodiments, the second magnetic layer includes iron, cobalt and boron.

In accordance with another aspect of the present disclosure, a magnetic memory includes a SOT magnetic device and a switching element. The SOT magnetic device includes a bottom metal layer, a first magnetic layer disposed over the bottom metal layer; a spacer layer disposed over the first magnetic layer, and a second magnetic layer disposed over the spacer layer. The switching device is coupled to the bottom metal layer or the second magnetic layer. A diffusion barrier layer for suppressing metal elements of the first magnetic layer from diffusing into the bottom metal layer is disposed between the bottom metal layer and the first magnetic layer. In one or more of the foregoing and following embodiments, the first magnetic layer includes iron and cobalt. In one or more of the foregoing and following embodiments, the diffusion barrier layer includes iron, and an atomic percentage of iron in the diffusion barrier layer is higher than an atomic percentage of iron in the first magnetic layer. In one or more of the foregoing and following embodiments, the first magnetic layer and the diffusion barrier layer further include boron. In one or more of the foregoing and following embodiments, an atomic percentage of the boron in the diffusion barrier layer is higher than an atomic percentage of the boron in the first magnetic layer. In one or more of the foregoing and following embodiments, the first magnetic layer is $Fe_xCo_yB_{1-x-y}$ and the diffusion barrier layer is $Fe_zB_{1-z}$, where z>x. In one or more of the foregoing and following embodiments, $0.50 \leq x \leq 0.70$ and $0.65 \leq z \leq 0.90$. In one or more of the foregoing and following embodiments, the diffusion barrier layer includes cobalt, and an atomic percentage of cobalt in the diffusion barrier layer is higher than an atomic percentage of cobalt in the first magnetic layer. In one or more of the foregoing and following embodiments, the diffusion barrier layer is made of magnesium. In one or more of the foregoing and following embodiments, the diffusion barrier layer is made of an oxide of tungsten or tantalum. In one or more of the foregoing and following embodiments, the bottom metal layer is made of tungsten or tantalum. In one or more of the foregoing and following embodiments, a thickness of the diffusion barrier layer is in a range from 0.1 nm to 0.6 nm. In one or more of the foregoing and following embodiments, the SOT magnetic device further includes an intermediate metal layer disposed between the spacer layer and the second magnetic layer. In one or more of the foregoing and following embodiments, the intermediate metal layer is made of magnesium and the spacer layer is made of magnesium oxide. In one or more of the foregoing and following embodiments, the SOT magnetic device further includes a top metal layer disposed over the second magnetic layer. In one or more of the foregoing and following embodiments, the top metal layer is made of ruthenium. In one or more of the foregoing and following embodiments, the second magnetic layer includes iron, cobalt and boron.

In accordance with one aspect of the present disclosure, in a method of manufacturing a spin-orbit-torque (SOT) magnetic device, a first magnetic layer is formed over a bottom metal layer. A spacer layer is formed over the first magnetic layer. A second magnetic layer is formed over the spacer layer. Further, a diffusion barrier layer is formed between the first magnetic layer and the bottom metal layer. In one or more of the foregoing and following embodiments, the diffusion barrier layer is formed by a thermal annealing performed after the first magnetic layer is formed. In one or more of the foregoing and following embodiments, a process temperature of the thermal annealing is in a range from 350° C. to 450° C. In one or more of the foregoing and following embodiments, a process time of the thermal annealing is in a range from 30 min to 240 min. In one or more of the foregoing and following embodiments, the diffusion barrier layer is formed by a plasma treatment on the first magnetic layer performed after the first magnetic layer is formed. In one or more of the foregoing and following embodiments, at least one plasma of argon, nitrogen and hydrogen is used in the plasma treatment. In one or more of the foregoing and following embodiments, a process time of the plasma treatment is in a range from 1 min to 60 min. In one or more of the foregoing and following embodiments, the first magnetic layer includes iron and cobalt, the diffusion barrier layer includes iron, and an atomic percentage of iron in the diffusion barrier layer is higher than an atomic percentage of iron in the first magnetic layer. In one or more of the foregoing and following embodiments, the first magnetic layer and the diffusion barrier layer further include boron. In one or more of the foregoing and following embodiments, an atomic percentage of the boron in the diffusion barrier layer is higher than an atomic percentage of the boron in the first magnetic layer. In one or more of the foregoing and following embodiments, the first magnetic layer is $Fe_xCo_yB_{1-x-y}$ and the diffusion barrier layer is $Fe_zB_{1-z}$, where z>x. In one or more of the foregoing and following embodiments, $0.50 \leq x \leq 0.70$ and $0.65 \leq z \leq 0.90$. In one or more of the foregoing and following embodiments, the first magnetic layer includes iron and cobalt, the diffusion barrier layer includes cobalt, and an atomic percentage of cobalt in the diffusion barrier layer is higher than an atomic percentage of cobalt in the first magnetic layer. In one or more of the foregoing and following embodiments, the diffusion barrier layer is formed by a deposition process. In one or more of the foregoing and following embodiments, the diffusion barrier layer is made of magnesium. In one or more of the foregoing and following embodiments, the diffusion barrier layer is made of an oxide of tungsten or tantalum. In one or more of the foregoing and following embodiments, the diffusion barrier layer is made by oxidation of the bottom metal layer. In one or more of the foregoing and following embodiments, the bottom metal layer is made of tungsten or tantalum and the diffusion barrier layer is made of an oxide of tungsten or tantalum. In one or more of the foregoing and following embodiments, a thickness of the diffusion barrier layer is in a range from 0.1 nm to 0.6 nm.

In accordance with another aspect of the present disclosure, in a method of manufacturing a SOT magnetic device, a diffusion barrier layer is formed over a bottom metal layer. A first magnetic layer is formed over the diffusion barrier layer. A spacer layer is formed over the first magnetic layer. An intermediate metal layer is formed over the spacer layer. A second magnetic layer is formed over the intermediate metal layer. The diffusion barrier layer suppresses metal elements of the first magnetic layer from diffusing into the bottom metal layer in a subsequent thermal process exceeding 450° C. In one or more of the foregoing and following embodiments, the diffusion barrier layer is formed by a thermal annealing performed after the first magnetic layer is formed. In one or more of the foregoing and following embodiments, a process temperature of the thermal annealing is in a range from 350° C. to 450° C. In one or more of the foregoing and following embodiments, a process time of the thermal annealing is in a range from 30 min to 240 min. In one or more of the foregoing and following embodiments, the diffusion barrier layer is formed by a plasma treatment on the first magnetic layer performed after the first magnetic layer is formed. In one or more of the foregoing and following embodiments, at least one plasma of argon, nitrogen and hydrogen is used in the plasma treatment. In one or more of the foregoing and following embodiments, a process time of the plasma treatment is in a range from 1 min to 60 min. In one or more of the foregoing and following embodiments, the first magnetic layer includes iron and cobalt, the diffusion barrier layer includes iron, and an atomic percentage of iron in the diffusion barrier layer is higher than an atomic percentage of iron in the first magnetic layer. In one or more of the foregoing and following embodiments, the first magnetic layer and the diffusion barrier layer further include boron. In one or more of the foregoing and following embodiments, an atomic percentage of the boron in the diffusion barrier layer is higher than an atomic percentage of the boron in the first magnetic layer. In one or more of the foregoing and following embodiments, the first magnetic layer is $Fe_xCo_yB_{1-x-y}$ and the diffusion barrier layer is $Fe_zB_{1-z}$, where z>x. In one or more of the foregoing and following embodiments, 0.50≤x≤0.70 and 0.65≤z≤0.90. In one or more of the foregoing and following embodiments, the first magnetic layer includes iron and cobalt, the diffusion barrier layer includes cobalt, and an atomic percentage of cobalt in the diffusion barrier layer is higher than an atomic percentage of cobalt in the first magnetic layer. In one or more of the foregoing and following embodiments, the diffusion barrier layer is formed by a deposition process. In one or more of the foregoing and following embodiments, the diffusion barrier layer is made of magnesium. In one or more of the foregoing and following embodiments, the diffusion barrier layer is made of an oxide of tungsten or tantalum. In one or more of the foregoing and following embodiments, the diffusion barrier layer is made by oxidation of the bottom metal layer. In one or more of the foregoing and following embodiments, the bottom metal layer is made of tungsten or tantalum, and the diffusion barrier layer is made of an oxide of tungsten or tantalum. In one or more of the foregoing and following embodiments, a thickness of the diffusion barrier layer is in a range from 0.1 nm to 0.6 nm.

In accordance with another aspect of the present disclosure, in a method of manufacturing a SOT magnetic device, a first magnetic layer is formed over a bottom metal layer. The first magnetic layer is treated so that a diffusion barrier layer is formed between the bottom metal layer and the first magnetic layer. A spacer layer is formed over the first magnetic layer. An intermediate metal layer is formed over the spacer layer. A second magnetic layer is formed over the intermediate metal layer. The diffusion barrier layer suppresses metal elements of the first magnetic layer from diffusing into the bottom metal layer in a subsequent thermal process exceeding 450° C. In one or more of the foregoing and following embodiments, the diffusion barrier layer is formed by a thermal annealing performed after the first magnetic layer is formed. In one or more of the foregoing and following embodiments, a process temperature of the thermal annealing is in a range from 350° C. to 450° C. In one or more of the foregoing and following embodiments, a process time of the thermal annealing is in a range from 30 min to 240 min. In one or more of the foregoing and following embodiments, the diffusion barrier layer is formed by a plasma treatment on the first magnetic layer performed after the first magnetic layer is formed. In one or more of the foregoing and following embodiments, at least one plasma of argon, nitrogen and hydrogen is used in the plasma treatment. In one or more of the foregoing and following embodiments, a process time of the plasma treatment is in a range from 1 min to 60 min. In one or more of the foregoing and following embodiments, the first magnetic layer includes iron and cobalt, the diffusion barrier layer includes iron, and an atomic percentage of iron in the diffusion barrier layer is higher than an atomic percentage of iron in the first magnetic layer. In one or more of the foregoing and following embodiments, the first magnetic layer and the diffusion barrier layer further include boron. In one or more of the foregoing and following embodiments, an atomic percentage of the boron in the diffusion barrier layer is higher than an atomic percentage of the boron in the first magnetic layer. In one or more of the foregoing and following embodiments, the first magnetic layer is $Fe_xCo_yB_{1-x-y}$ and the diffusion barrier layer is $Fe_zB_{1-z}$ where z>x. In one or more of the foregoing and following embodiments, 0.50≤x≤0.70 and 0.65≤z≤0.90. In one or more of the foregoing and following embodiments, the first magnetic layer includes iron and cobalt, the diffusion barrier layer includes cobalt, and an atomic percentage of cobalt in the diffusion barrier layer is higher than an atomic percentage of cobalt in the first magnetic layer. In one or more of the foregoing and following embodiments, the diffusion barrier layer is formed by a deposition process. In one or more of the foregoing and following embodiments, the diffusion barrier layer is made of magnesium. In one or more of the foregoing and following embodiments, the diffusion barrier layer is made of an oxide of tungsten or tantalum. In one or more of the foregoing and following embodiments, the diffusion barrier layer is made by oxidation of the bottom metal layer. In one or more of the foregoing and following embodiments, the bottom metal layer is made of tungsten or tantalum and the diffusion barrier layer is made of an oxide of tungsten or tantalum. In one or more of the foregoing and following embodiments, a thickness of the diffusion barrier layer is in a range from 0.1 nm to 0.6 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A spin-orbit-torque (SOT) magnetic device, comprising:
- a bottom metal layer;
- a first magnetic layer disposed over the bottom metal layer;
- a spacer layer disposed over the first magnetic layer;
- a second magnetic layer disposed over the spacer layer; and
- a diffusion barrier layer disposed between the bottom metal layer and the first magnetic layer,
- wherein the diffusion barrier layer includes at least one of iron or cobalt, and suppresses an element of the first magnetic layer from diffusing into the bottom metal layer.

2. The SOT magnetic device of claim 1, wherein the first magnetic layer includes iron and cobalt.

3. The SOT magnetic device of claim 2, wherein:
- the diffusion barrier layer includes iron, and
- an atomic percentage of iron in the diffusion barrier layer is higher than an atomic percentage of iron in the first magnetic layer.

4. The SOT magnetic device of claim 3, wherein the first magnetic layer and the diffusion barrier layer further include boron.

5. The SOT magnetic device of claim 4, wherein an atomic percentage of the boron in the diffusion barrier layer is higher than an atomic percentage of the boron in the first magnetic layer.

6. The SOT magnetic device of claim 2, wherein:

the first magnetic layer is $Fe_xCo_yB_{1-x-y}$, and the diffusion barrier layer is $Fe_zB_{1-z}$, where z>x.

7. The SOT magnetic device of claim 6, wherein 0.50≤x≤0.70 and 0.65≤z≤0.90.

8. The SOT magnetic device of claim 2, wherein:

the diffusion barrier layer includes cobalt, and an atomic percentage of cobalt in the diffusion barrier layer is higher than an atomic percentage of cobalt in the first magnetic layer.

9. The SOT magnetic device of claim 1, wherein a thickness of the diffusion barrier layer is in a range from 0.1 nm to 0.6 nm.

10. The SOT magnetic device of claim 1, further comprising an intermediate metal layer disposed between the spacer layer and the second magnetic layer.

11. The SOT magnetic device of claim 10, wherein the intermediate metal layer is made of magnesium and the spacer layer is made of magnesium oxide.

12. The SOT magnetic device of claim 1, further comprising a top metal layer disposed over the second magnetic layer.

13. The SOT magnetic device of claim 12, wherein the top metal layer is made of ruthenium.

14. The SOT magnetic device of claim 1, wherein the second magnetic layer includes iron, cobalt and boron.

15. A spin-orbit-torque (SOT) magnetic device, comprising:

a bottom metal layer;

a first magnetic layer disposed over the bottom metal layer;

a spacer layer disposed over the first magnetic layer;

a second magnetic layer disposed over the spacer layer; and a diffusion barrier layer disposed between a magnetic dead layer and the first magnetic layer, wherein:

the magnetic dead layer is disposed between the bottom metal layer and the first magnetic layer, and the diffusion barrier layer suppresses an element of the first magnetic layer from diffusing into the bottom metal layer.

16. The SOT magnetic device of claim 15, wherein:

the first magnetic layer is $Fe_xCo_yB_{1-x-y}$, and the diffusion barrier layer is $Fe_zB_{1-z}$, where z>x.

17. A spin-orbit-torque (SOT) magnetic device, comprising:

a bottom metal layer;

a first magnetic layer disposed over the bottom metal layer;

a spacer layer disposed over the first magnetic layer;

a second magnetic layer disposed over the spacer layer; and a diffusion barrier layer disposed between the bottom metal layer and the first magnetic layer, wherein the diffusion barrier layer includes at least one of boron, magnesium or tantalum.

18. The SOT magnetic device of claim 17, wherein the diffusion barrier layer is made of magnesium.

19. The SOT magnetic device of claim 17, wherein the diffusion barrier layer is made of an oxide of tantalum.

20. The SOT magnetic device of claim 17, wherein the bottom metal layer is made of tantalum.

* * * * *